United States Patent [19]

Lesk et al.

[11] Patent Number: 4,924,291
[45] Date of Patent: May 8, 1990

[54] FLAGLESS SEMICONDUCTOR PACKAGE

[75] Inventors: Israel A. Lesk, Phoenix; George W. Hawkins, Mesa; Ronald E. Thomas, Tempe; William L. Hunter, Scottsdale, all of Ariz.; Michael B. McShane; James J. Casto, both of Austin, Tex.

[73] Assignee: Motorola Inc., Schaumburg, Ill.

[21] Appl. No.: 261,439

[22] Filed: Oct. 24, 1988

[51] Int. Cl.⁵ ............................................. H01L 23/48
[52] U.S. Cl. ......................................... 357/70; 357/72
[58] Field of Search ................. 357/69, 74, 72, 81, 357/70

[56] References Cited

U.S. PATENT DOCUMENTS

| | | | |
|---|---|---|---|
| 3,716,761 | 2/1973 | Rotast | 317/101 B |
| 3,902,148 | 8/1975 | Drees et al. | 357/69 |
| 4,466,183 | 8/1984 | Burns | 357/69 |
| 4,489,465 | 12/1984 | Daberkoe | 361/403 |
| 4,578,697 | 3/1986 | Takemae | 357/75 |
| 4,595,945 | 6/1986 | Graver | 357/70 |
| 4,612,564 | 9/1986 | Moyer | 357/70 |

Primary Examiner—James W. Davie
Attorney, Agent, or Firm—Harry A. Wolin

[57] ABSTRACT

A molded semiconductor package having a flagless leadframe wherein a semiconductor die is disposed in or above a die opening of a leadframe. This allows for thin, symmetrical packages and packages having a minimum number of material interfaces to be manufactured because no leadframe flags and minimal die bond material are employed. The present invention further includes guard rings to protect high stress areas of the semiconductor die from damage and heat spreaders to more effectively spread heat dissipated by the semiconductor die.

19 Claims, 3 Drawing Sheets

FLAGLESS SEMICONDUCTOR PACKAGE

BACKGROUND OF THE INVENTION

This invention relates, in general, to molded semiconductor packages, and more particularly to a molded semiconductor package having a flagless leadframe.

Molded semiconductor packages generally comprise a semiconductor die mounted on the flag of a metal leadframe wherein the semiconductor die is electrically connected to the leads of the metal leadframe by wire bonds. The semiconductor die, the wire bonds and the leadframe, excepting the leads, are then encapsulated in plastic. There are many problems inherent with this type package. These problems include the package being relatively thick, asymmetric, and having a maximum number of material interfaces. An asymmetric package creates increased bonding stresses that act on the die while material interfaces cause a molded semiconductor package to be more susceptible to failure during vapor phase, solder dip, infra red and high stress testing.

A prominent test for molded semiconductor packages is to saturate them with moisture or water vapor, followed within a short time by immersion in either a solvent vapor or a liquid solder at or above the soldering temperature. Water absorption in some currently used plastic molded packages has been measured by a weight gain of 0.4%. Upon sudden heating, this water will vaporize and rapidly build up pressure. This results in packages that may crack, and in extreme cases, literally blow apart. This test is particularly destructive if there is condensed water in package voids that generally occur at the material interfaces. Even if the molding is perfect, voids may still be produced as a result of mechanical stresses in the package due to thermal expansion differences between the molding compound, mounting flag and silicon die.

Cracks in the molding compound have occurred at die and flag corners while separations have occurred between the die and flag, die and molding compound and the flag and molding compound. It is also common for voids to occur at the die bond areas. Cracks and separations in molded semiconductor packages are especially detrimental in that they cause damage to the wire bonds as well as to the die. It is common for large amounts of stress to act upon the semiconductor die, especially at the sides and corners as a crack propagates throughout the plastic molding compound. Commonly, a separation of the passivation layer from the remainder of the die results and causes damage to the metal circuitry of the semiconductor die. Of course, this results in failure of the semiconductor device Therefore, it would be highly desirable to have a molded semiconductor package that is thin, symmetrical so as to eliminate various bonding stresses and has a minimum number of material interfaces so as to reduce the number of voids contained therein.

Another problem commonly encountered with the use of molded semiconductor packages is that of heat dissipation. It is desirable for heat to flow out of the package through the metal leads because only a minimal amount of heat will actually flow out through the plastic encapsulation itself Heat often encounters difficulty in flowing from the die to the leads and is essentially trapped within the plastic package. This heat is liable to cause temperature cycling damage due to the thermal expansion coefficient mismatch of the various materials as well as inhibiting device performance Therefore, an improved thermal path would also be highly desirable.

SUMMARY OF THE INVENTION

Accordingly, it is an object of the present invention to provide a molded semiconductor package having a flagless leadframe that allows for a thin package without wafer thinning.

Another object of this invention is to provide a molded semiconductor package having a flagless leadframe that is symmetrical.

It is an additional object of the present invention to provide a molded semiconductor package having a flagless leadframe that has a minimum number of material interfaces.

Yet a further object of the present invention is to provide a molded semiconductor package having a flagless leadframe that has a reduced failure rate due to moisture saturation.

An even further object of the present invention is to provide a molded semiconductor package having a flagless leadframe that is less susceptible to thermal cycling stress damage.

The foregoing and other objects and advantages are achieved in the present invention by one embodiment in which, as a part thereof, makes use of a flagless leadframe. A semiconductor die is mounted either within a die opening of the leadframe and essentially coplanar with it or on the leadframe itself, directly above a die opening. This allows for thinner, more symmetrical packages having a minimum number of material interfaces It is also possible to include guard rings for protection of the semiconductor die as well as heat spreaders to enhance the dissipation of heat to the leads.

A more complete understanding of the present invention can be attained by considering the following detailed description in conjunction with the accompanying drawings.

DETAILED DESCRIPTION OF THE INVENTION

Figure 1:
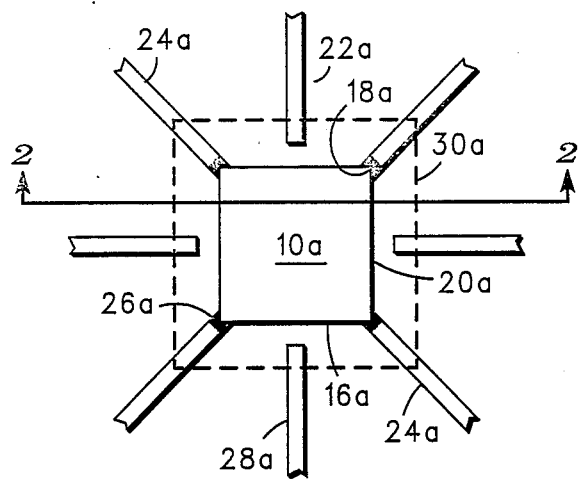
FIG. 1 is an enlarged top-view of a portion of a first embodiment of the present invention.
Figure 2:
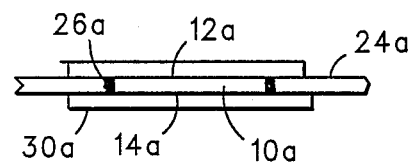
FIG. 2 is an enlarged cross-sectional view of a portion of the first embodiment of the present invention taken from line 2—2 of FIG. 1.

FIG. 1 is an enlarged top view and FIG. 2 is an enlarged cross-sectional view taken from line 2—2 of FIG. 1 of portions of a molded semiconductor package having a flagless leadframe 22a. A semiconductor die 10a includes a first surface 12a, a second surface 14a, sides 16a and corners 18a. Semiconductor die 10a is disposed in die opening 20a of leadframe 22a which is larger than the periphery of semiconductor die 10a in this embodiment. Leadframe 22a further includes corner leads 24a which serve to bond semiconductor die 10a to leadframe 22a and electrical bonding leads 28a which serve as electrical contacts to the semiconductor package. In this embodiment, an organic adhesive 26a is employed to bond die bonding leads 24a to semiconductor die 10a at corners 18a although an inorganic adhesive could be used. Leads other than corner leads 24a may be used to bond semiconductor die 10a to leadframe 22a. For example, certain leads 28a could be bonded to semiconductor die 10a at its sides 16a, in which case corner leads 24a could be used to make electrical contacts. Electrical bonding leads 28a are selectively wire bonded to semiconductor die 10a to form the electrical contacts. One skilled in the art will recognize that unused electrical bonding leads 28a may be included in leadframe 22a to enhance heat dissipation.

An encapsulation 30a is shown disposed about semiconductor die 10a as well as portions of corner leads 24a and electrical bonding leads 28a. One skilled in the art will understand that the wire bonds (not shown) are also encapsulated by encapsulation 30a. It should be noted that electrical bonding leads 28a extend from encapsulation 30a to serve as external contacts to the molded package. Encapsulation 30a is comprised of molded plastic in this embodiment, however, it should be understood that many well known encapsulants may be employed.

It should be noted that the semiconductor package illustrated by FIGS. 1 and 2 is substantially symmetrical. This is because leads 24a and 28a are essentially coplanar with semiconductor die 10a. Because the package is symmetrical, some stresses are reduced and semiconductor die 10a is subject to lesser amounts of stress. Further, the absence of a flag in leadframe 22a allows for a thinner package which is always desirable to save space. Additionally, there are a limited number of material interfaces because there is no flag and no die bond material bonding semiconductor die 10a thereto.

Figure 3:
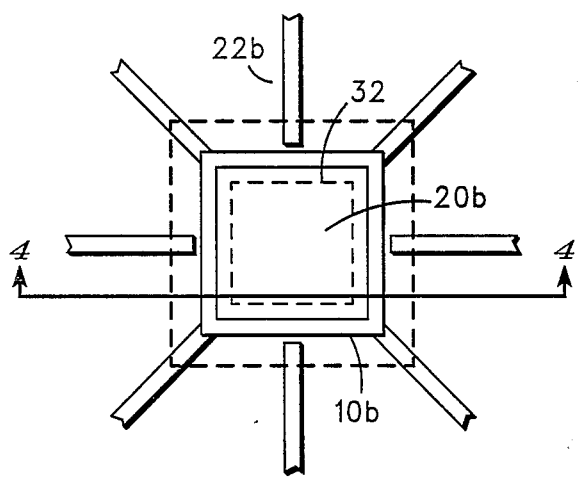
FIG. 3 is an enlarged top-view of a portion of a second embodiment of the present invention.
Figure 4:
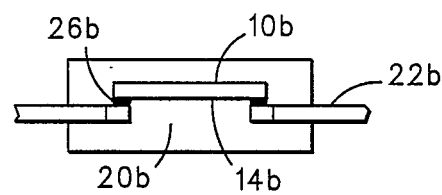
FIG. 4 is an enlarged cross-sectional view of a portion of the second embodiment of the present invention taken from line 4—4 of FIG. 3.

FIG. 3 is an enlarged top view and FIG. 4 is an enlarged cross-sectional view taken from line 4—4 of FIG. 3, of portions of a molded semiconductor package having a flagless leadframe 22b. In this embodiment, the periphery of semiconductor die 10b is larger than die opening 20b, depicted by dotted line 32. Second surface 14b of semiconductor die 10b is bonded to leadframe 22b above die opening 20b. Again, semiconductor die 10b is bonded to leadframe 22b by organic adhesive 26b although other adhesives may be employed. Although the embodiment depicted in FIGS. 3 and 4 is not symmetrical, it includes a reduced number of material interfaces because it contains no flag and does not have a complete layer of die bond material. The reduced number of material interfaces creates fewer voids within the semiconductor package thereby making it less susceptible to moisture saturation.

Figure 5:
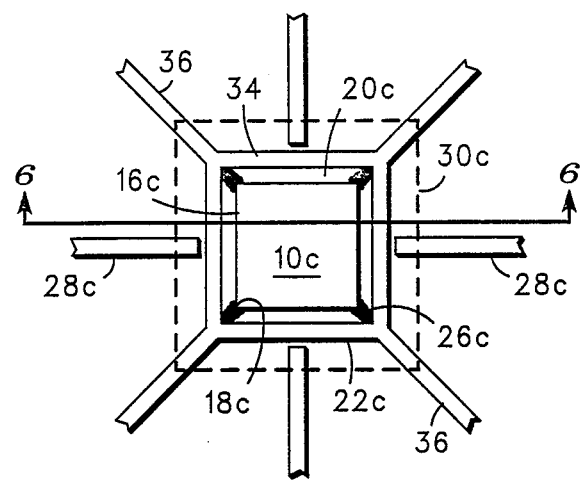
FIG. 5 is an enlarged top-view of a portion of a third embodiment of the present invention.
Figure 6:
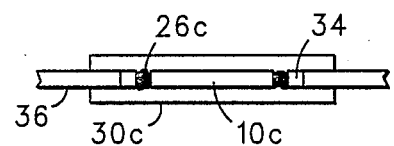
FIG. 6 is an enlarged cross-sectional view of a portion of the third embodiment of the present invention taken from line 6—6 of FIG. 5.

FIG. 5 illustrates an enlarged top view and FIG. 6 is an enlarged cross-sectional view taken from line 6—6 of FIG. 5 of portions of a molded semiconductor package having a flagless leadframe 22c. This embodiment further includes a guard ring 34. Guard ring 34 is a part of leadframe 22c in this embodiment and is comprised of the same material as leadframe 22c. It can be seen that guard ring 34 attaches to support leads 36 of leadframe 22c. Guard ring 34 is not physically connected to electrical bonding leads 28c and therefore, does not hinder electrical connections within the package.

Guard ring 34 defines the periphery of die opening 20c. Semiconductor die 10c is disposed in die opening 20c and is bonded thereto by organic adhesive 26c at its corners 18c. Again, it should be understood that semiconductor die 10c may be bonded to guard ring 34 of leadframe 22c by organic adhesive 26c or another adhesive at its sides 16c. Because guard ring 34 protects the high stress sides 16c and corners 18c of semiconductor die 10c, stress does not readily damage it and the lifetime of the semiconductor package is thereby increased. Again, it should be noted that a symmetrical package has been created. This is extremely beneficial for the reasons discussed earlier.

Figure 7:
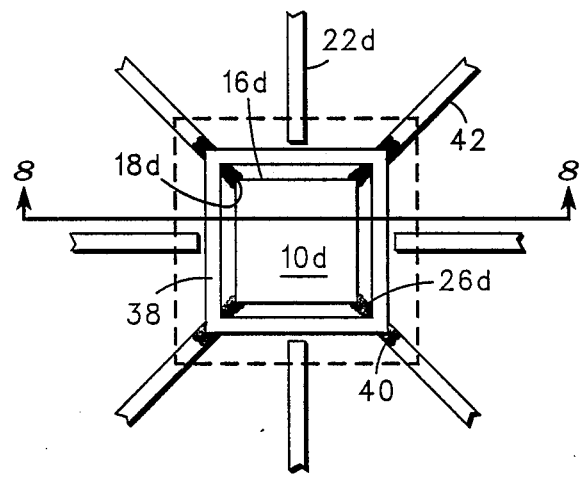
FIG. 7 is an enlarged top view of a portion of a fourth embodiment of the present invention.
Figure 8:
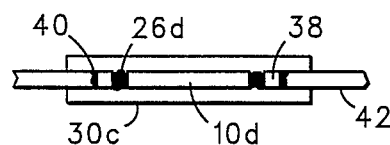
FIG. 8 is an enlarged cross-sectional view of a portion of the fourth embodiment of the present invention taken from line 8—8 of FIG. 7.

FIG. 7 is an enlarged top view and FIG. 8 is an enlarged cross-sectional view taken from line 8—8 of FIG. 7 of portions of a molded semiconductor package having a flagless leadframe 22d. This embodiment includes a guard ring 38 that is not part of leadframe 22d. Guard ring 38 may be comprised of metal, plastic, silicon, ceramic or one of many other materials having a coefficient of thermal expansion similar to the material of leadframe 22d. It should be understood guard ring 38 may be comprised of a different material than leadframe 22d. Guard ring 38 is disposed around semiconductor die 10d and is bonded thereto by organic adhesive 26d. Again, semiconductor die 10d is bonded to guard ring 38 at corners 18d, however, it should be understood that bonding may occur at sides 16d. Guard ring 38 is also bonded to bonding leads 42 of leadframe 22d. Although an organic adhesive 40 is employed in this embodiment to adhere bonding leads 42 to guard ring 38, it should be understood that many other adhesives may be used. Guard ring 38 serves to protect the high stress areas of semiconductor die 10d as does guard ring 34, discussed earlier. Again, the resulting package is relatively thin, substantially symmetrical and has a minimum number of material interfaces due to the exclusion of a leadframe flag.

Figure 9:
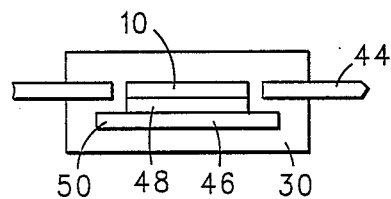
FIG. 9 is an enlarged cross-sectional view of a portion of an embodiment of the present invention including a heat spreader.
Figure 10:
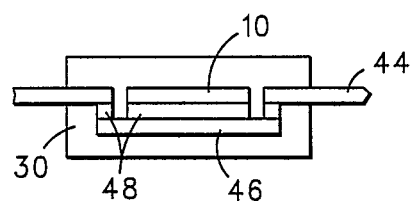
FIG. 10 is an enlarged cross-sectional view of a portion of an embodiment of the present invention including a heat spreader.
Figure 11:
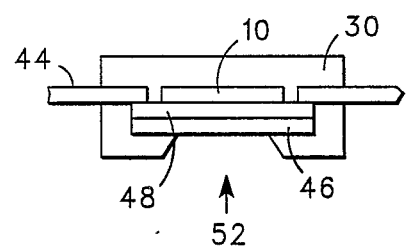
FIG. 11 is an enlarged cross-sectional view of a portion of an embodiment of the present invention including a heat spreader with an exposed heat dissipation path.

FIGS. 9, 10 and 11 are enlarged cross-sectional views of portions of molded semiconductor packages having flagless leadframes. A commonly encountered problem of packages of this type is the dissipation of heat given off by semiconductor die 10. Generally, the majority of heat dissipates from the package through metal leads 44 while a minimal amount of heat dissipates through plastic encapsulation 30. A heat spreader 46 serves to transfer heat from semiconductor die 10 to metal leads 44. Heat spreader 46 is comprised of copper in this embodiment, however, it should be understood that many good thermal conducting materials may be employed.

FIG. 9 illustrates an insulating adhesive 48 being disposed between heat spreader 46 and semiconductor die 10. Insulating adhesive 48 may be comprised of a material such as polyimide, however it should be understood that many other electrically insulating materials may be employed. Because of the thinness of insulating adhesive 48, heat will easily dissipate from semiconductor die 10 through electrical insulator 48 to heat spreader 46. Once the heat dissipates to heat spreader 46, it will travel towards ends 50 of heat spreader 46 and then dissipate through plastic encapsulation 30 to metal leads 44. FIG. 10 is very similar to FIG. 9 except that insulating adhesive 48 is further disposed between metal leads 44 and heat spreader 46. One skilled in the art will understand that insulating adhesive 48 will hold metal leads 44, heat spreader 46 and semiconductor die 10 in a predetermined position and therefore, no other adhesive need be used.

FIG. 11 illustrates a slightly different method of enhancing the dissipation of heat from semiconductor die 10. Insulating adhesive 48 extends along the length of heat spreader 46 so that it contacts metal support leads 44 as well as heat spreader 46. Here, insulator 48 also prevents shorting In FIGS. 10 and 11, heat does not have to dissipate at all through plastic encapsulation 30 in order to reach metal support leads 44. FIG. 11 also discloses a recess 52 in plastic encapsulation 30 that exposes heat spreader 46. As a result, heat may dissipate from the semiconductor package directly through heat spreader 46 without the need of dissipating through plastic encapsulation 30 or metal support leads 44.

Thus it is apparent that there has been provided, in accordance with the invention, an improved molded semiconductor package having a flagless leadframe. While specific embodiments of the invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention

We claim:

1. A molded semiconductor package having a flagless leadframe comprising:
   a semiconductor die having a first surface, a second surface, sides and corners;
   a flagless leadframe including leads and a die opening, said leadframe being physically bonded to said semiconductor die and further,, said leads of said leadframe being wire bonded to said semiconductor die in a selective manner; and
   an encapsulation disposed about said semiconductor die and said leadframe except for said leads which protrude therefrom.

2. The molded semiconductor package of claim 1 wherein the die opening is larger than the semiconductor die disposed therein, the leadframe is essentially coplanar with said semiconductor die and said package is substantially symmetrical.

3. The molded semiconductor package of claim 2 wherein the leadframe is bonded to one or both of the sides and corners of the semiconductor die by an organic adhesive.

4. The molded semiconductor package of claim 2 further comprising a guard ring being disposed about the semiconductor die, said guard ring being a part of the leadframe or separate from said leadframe.

5. The molded semiconductor package of claim 4 wherein the guard ring is disposed between the leadframe and the semiconductor die and is bonded to at least one or both of the sides and corners of said semiconductor die by an organic adhesive.

6. The molded semiconductor package of claim 1 wherein the die opening is smaller than the semiconductor die and the second surface of said semiconductor die is bonded to the leadframe above said die opening.

7. The molded semiconductor package of claim 1 further comprising a thermally conductive heat spreader coupled to the second surface of the semiconductor die by an insulating adhesive material.

8. The molded semiconductor package of claim 7 wherein the thermally conductive heat spreader is coupled to the leads of the leadframe by an insulating adhesive material.

9. The molded semiconductor package of claim 7 wherein the thermally conductive heat spreader is not completely encapsulated by the encapsulation.

10. A substantially symmetrical molded semiconductor package having a flagless leadframe comprising:
    a semiconductor die having a first surface, a second surface, sides and corners;
    a flagless leadframe including leads and a die opening, said leadframe being disposed about and bonded to said semiconductor die, said leadframe further being essentially coplanar with and wire bonded to said semiconductor die in a selective manner; and
    an encapsulation disposed about said semiconductor die and said leadframe except for said leads which protrude therefrom.

11. The molded semiconductor package of claim 10 wherein the leadframe is bonded to one or both of the sides and corners of the semiconductor die by an organic adhesive.

12. The molded semiconductor package of claim 10 further comprising a guard ring disposed between the leadframe and the semiconductor die, said guard ring being a part of the leadframe or separate from the leadframe and bonded to at least one of the sides or corners of said semiconductor die by an organic adhesive.

13. The molded semiconductor package of claim 10 further comprising a thermally conductive heat spreader coupled to the second surface of the semiconductor die by an insulating adhesive material.

14. The molded semiconductor package of claim 13 wherein the thermally conductive heat spreader is coupled to the leads of the leadframe by an insulating adhesive material.

15. The molded semiconductor package of claim 13 wherein the thermally conductive heat spreader is not completely encapsulated by the encapsulation.

16. A molded semiconductor package having a flagless leadframe comprising:
    a semiconductor die having a first surface, a second surface, sides and corners;
    a flagless leadframe including leads and a die opening, said die opening being smaller than said semiconductor die and said second surface of said semiconductor die being bonded to said leadframe above said opening said semiconductor die further being selectively wire bonded to said leads of said leadframe; and
    an encapsulation disposed about said semiconductor die and said leadframe except for said leads which protrude therefrom.

17. The molded semiconductor package of claim 16 further comprising a thermally conductive heat spreader coupled to the second surface of the semiconductor die by an insulating adhesive material.

18. The molded semiconductor package of claim 17 wherein the thermally conductive heat spreader is coupled to the leads of the leadframe by an insulating adhesive material.

19. The molded semiconductor package of claim 17 wherein the thermally conductive heat spreader is not completely encapsulated by the encapsulation.

* * * * *